(12) United States Patent
Beck et al.

(10) Patent No.: US 9,031,803 B2
(45) Date of Patent: May 12, 2015

(54) WAVEFORM DISPLAY METHOD AND A SIGNAL MEASUREMENT SYSTEM IMPLEMENTING THE SAME

(75) Inventors: Douglas James Beck, Colorado Springs, CO (US); John Howard Friedman, Colorado Springs, CO (US); Michael R. Fender, Colorado Springs, CO (US); Takuya Furuta, Colorado Springs, CO (US)

(73) Assignee: Keysight Technologies, Inc., Santa Rosa, CA (US)

( * ) Notice: Subject to any disclaimer, the term of this patent is extended or adjusted under 35 U.S.C. 154(b) by 1751 days.

(21) Appl. No.: 12/323,477

(22) Filed: Nov. 26, 2008

(65) Prior Publication Data

US 2010/0131220 A1 May 27, 2010

(51) Int. Cl.
*G01R 13/02* (2006.01)
(52) U.S. Cl.
CPC .............. *G01R 13/029* (2013.01); *G01R 13/02* (2013.01)

(58) Field of Classification Search
USPC .......................................................... 702/67
See application file for complete search history.

(56) References Cited

U.S. PATENT DOCUMENTS

| 4,716,345 A | * | 12/1987 | Shank et al. | 315/392 |
| 6,559,868 B2 | * | 5/2003 | Alexander et al. | 715/781 |
| 6,989,833 B2 | * | 1/2006 | Narita | 345/440.1 |
| 2008/0071488 A1 | * | 3/2008 | Cake et al. | 702/67 |

* cited by examiner

*Primary Examiner* — John Breene
*Assistant Examiner* — Timothy H Hwang

(57) ABSTRACT

A waveform display method is disclosed. The method includes determining the narrowest pulse in a waveform for display and determining an available pixel width for displaying the narrowest pulse in a first display portion if the entire waveform is to be displayed in the first display portion. The pixel width is measure in terms of a number of pixels. The method further includes displaying the entire waveform or a portion thereof in the first display portion depending on the available pixel width. A signal measurement system that implements the method is also disclosed.

20 Claims, 6 Drawing Sheets

WAVEFORM DISPLAY METHOD AND A SIGNAL MEASUREMENT SYSTEM IMPLEMENTING THE SAME

BACKGROUND

A conventional test and measurement system, such as a signal measurement system, typically provides a display grid commonly referred to as a graticule on which display elements are presented. The display grid divides the coordinate axes into a series of divisions. Waveforms are displayed on the graticule and are scaled vertically and horizontally to facilitate analysis. Typically, the horizontal scale represents sweep speed and is in units of seconds per division. The vertical scale represents signal amplitude and is in units of volts per division. A captured waveform or trace is stored as trace data in a memory of the signal measurement system for display. With ever increasing depth (number of acquired samples) of the signal measurement system, the amount of trace data can become far too large to display on the display screen. As a result, a user is only able to meaningfully view a small portion of the trace data at any one time. It is thus important for the user to know at least the location of the displayed portion within the trace so as to be able to select or navigate to a different portion of the trace.

One prior art signal measurement system that includes such a feature is disclosed in the U.S. Pat. No. 6,559,868, Alexander, entitled "Graphically relating a Magnified View to a simultaneously displayed Main View in a signal measurement system". FIG. 1 shows a display screen 2 of the signal measurement system prior to the invocation of a waveform magnification feature. The display screen 2 shows a memory bar 4 and a main waveform display 6A. The main waveform display 6A displays only a portion 8 of a trace stored in memory. Displayed in the memory bar 4 is a dummy waveform 10 that does not reflect the actual trace. The memory bar 2 includes a main selection window 12 therein that indicates the portion 8 of the trace that is currently displayed in the main waveform display 6A. Since the memory bar 2 does not show the actual trace, the operator is unable to know which portion of the trace is of interest and will need to navigate the entire trace to locate a desired portion.

When the waveform magnification feature is invoked, a further magnified waveform display 14 is provided as shown in FIG. 2. The display screen 2 is partitioned into a reduced-size main waveform display 6B and the magnified waveform display 14. The main waveform display 6B is now allocated a portion 16 of the display screen 2 while the magnified waveform display 14 is drawn in the portion 18 of the display screen 6 not occupied by the main waveform display 6B. The main waveform display 6B presents a selected portion 8 of the entire trace as described above. The magnified waveform display 14 presents a predetermined or selected portion 19 or region of the waveform portion 8 in the main waveform display 6B at some expanded scale. Such a magnified view of a desired region 19 of the displayed waveform portion 8 allows an operator to easily and accurately determine relative values between the waveform portion 8 and other displayed waveforms (not shown). The magnified view is also a useful and productive technique for displaying details of a displayed waveform portion 8 to better understand the behavior of the waveform portion 8 and its correlation with measured quantities such as peak-to-peak voltage, rise-time, etc. With the availability of both the main waveform display 6B and the magnified waveform display 14, more details of the trace are now displayable to make navigation easier than before.

BRIEF DESCRIPTION OF DRAWINGS

The invention will be better understood with reference to the drawings, in which.

DETAILED DESCRIPTION OF THE EMBODIMENTS

Figure 4:
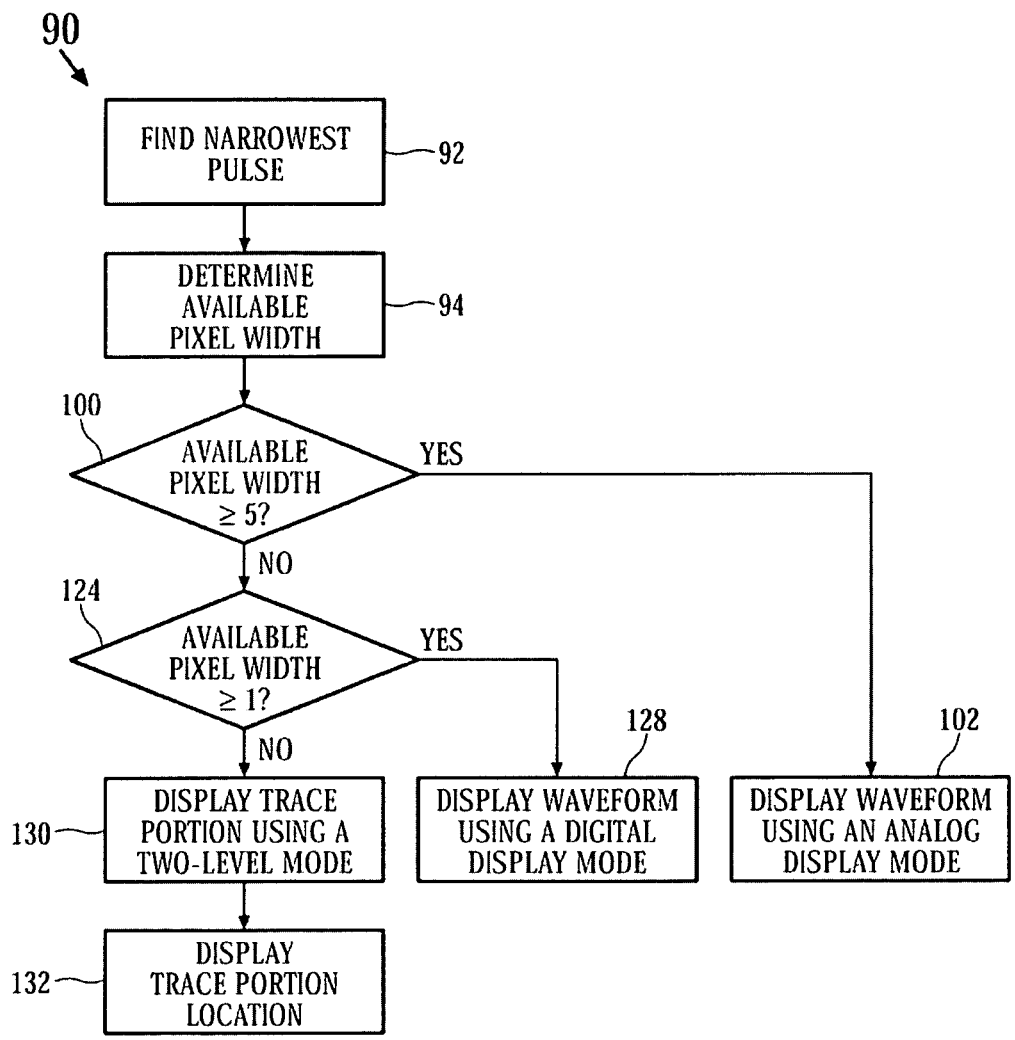
FIG. 4 is a flowchart showing a sequence of steps in the DSO in FIG. 3 for displaying waveform according to the method in FIG. 3.

As shown in the drawings for purposes of illustration, the invention may be embodied in a waveform display method. Existing waveform display methods do not include the display of a substantial portion of a waveform or trace in memory to allow informed navigation of the trace for selecting a relevant portion thereof for display. Referring to FIG. 4, a waveform display method embodying the invention generally includes determining the narrowest pulse in a trace. The method also includes determining an available pixel width for displaying the narrowest pulse in a first display portion of a display screen if the entire waveform is to be displayed in the first display portion. The pixel width is measured in terms of a number of pixels and the first display portion may include only a portion of the display screen or the entire display screen. The method further includes displaying the entire trace or a portion of the trace in the first display portion depending on the available pixel width.

Figure 3:
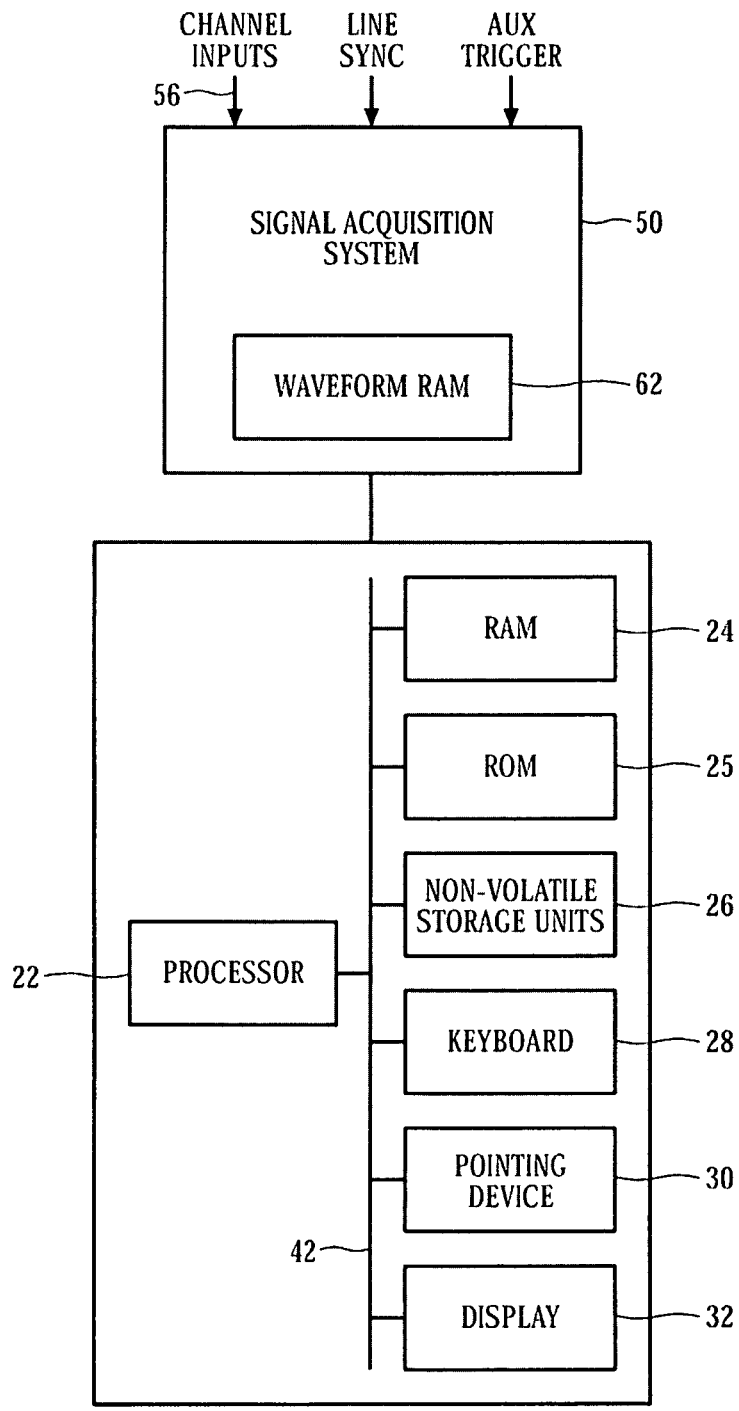
FIG. 3 is a functional block diagram of a digital storage oscilloscope (DSO), according to an embodiment of the invention, that is suitable for implementing a waveform display method according to another embodiment of the invention.

The above described method may be implemented in any signal measurement system. In one preferred embodiment of the present invention, the method is implemented in a test and measurement instrument, such as a digital storage oscilloscope (DSO), logic analyzer, network analyzer, spectrum analyzer, waveform generator or the like. FIG. 3 is a functional block diagram of an exemplary DSO 20 suitable for implementing the waveform display method. The DSO 20 may be a commonly-available DSO designed to acquire, analyze, and display a wide variety of signals generally in terms of signal voltage versus time. The DSO 20 preferably includes a general purpose computer system, which is programmable using a high-level computer programming language. The DSO 20 also includes special purpose hardware that is programmed for performing signal acquisition, analysis and display functions. More specifically, the DSO 20 includes a processor 22, a random access memory (RAM) 24, a read-only memory (ROM) 25, non-volatile storage units 26 such as a hard disk drive and a floppy disk drive, one or more input devices such as a keyboard 28 and a pointing device 30, and a display 32. The RAM 24 is used for storage of program instructions and for storage of results of calculations performed by the processor 22. The display 32 may include amongst others, a liquid crystal display and a plasma display. The display 32 is logically or physically divided into an array of picture elements referred to as pixels. The pointing devices 30 may include any well-known pointing devices such as a mouse, trackball or joystick.

The processor 22 usually executes a program referred to as an operating system (not shown). The operating system controls the execution of other computer programs such as a graphical user interface (GUI) (not shown) and the waveform display method, and provides scheduling, input/output control, file and data management, memory management and related services. The processor 22 and the operating system define a computer system for which application programs and high-level programming languages are written. The functional elements of the DSO 20 communicate with each other via one or more buses 42.

The DSO 20 further includes a signal acquisition sub-system 50. The signal acquisition sub-system 50 receives or acquires input signals through channel inputs 56 and performs signal conditioning and analog-to-digital conversion, all of which are controlled by the computer system. The signal acquisition subsystem 50 synchronizes the acquisition process, enabling the operator to arrange a trigger event to obtain a stable waveform display of the desired features of one or more of the input signals. Triggering of the signal acquisition system 50 may be based upon a line sync or auxiliary trigger input that is well-known in the art. Samples of the acquired input signals are stored in a waveform random access memory (RAM) 62.

The waveform display method will be described in more detail next with the aid of FIG. 4 which shows a flowchart of a sequence 90 of steps performed by the processor 22. The software routines for performing the waveform display method in accordance with an embodiment of the invention typically resides in the RAM 24, the ROM 25 and/or the storage units 26, and may be stored on a computer-readable program storage device such as, for example, magnetic disk, compact disk, or magnetic tape, and may be loaded into the DSO 20 using an appropriate peripheral device as is known in the art.

Preferably, the waveform display method is implemented in any well-known programming language such as C or C++. Those skilled in the relevant art will appreciate that different implementations, including different function names, programming languages, data structures, and/or algorithms may also be used in embodiments of the invention other than those described below. It should be further understood that the invention is not limited to a particular computer platform, particular operating system, particular processor, or particular high-level programming language, and that the hardware components identified above are given by way of example only. Portions of the waveform display method may also be implemented, for example, in dedicated hardware, firmware, or any combination thereof.

The illustrated operations of the waveform display method are performed by the processor 22 when the signal acquisition system 50 captures or acquires a signal and stores data associated with samples of the signal in the waveform RAM 62. For ease of description, the data stored in the waveform RAM 62 is referred hereafter as a waveform or trace. The sequence 90 starts in a FIND NARROWEST PULSE step 92, wherein the processor 22 determines the narrowest pulse in the waveform or trace. The sequence 90 next proceeds to a DETERMINE AVAILABLE PIXEL WIDTH step 94, wherein the processor 22 determines an available pixel width for displaying the narrowest pulse in a first display portion on a display screen 95 (FIG. 5A) of the display 32 if the entire stored trace is to be displayed in the first display portion. According to this embodiment, the first display portion may be a X-pixel by Y-pixel size memory bar 96 near a top of the display screen 95. The available pixel width thus includes a number of pixels in the horizontal direction that is available for displaying the narrowest pulse in the memory bar 96. The available pixel width is used to determine whether the entire trace stored in the waveform RAM 62 or only a portion of this entire trace is to be displayed in the memory bar 96. To do this, the sequence 90 proceeds to an AVAILABLE PIXEL WIDTH≥5? decision step 100, wherein the processor 22 determines if the available pixel width for displaying the narrowest pulse is greater than or equal to five pixels. Although in this embodiment the value of five pixels is used in this decision step 100, it should be recognized that a different number of pixels, such as three or more pixels, may also be used. In one embodiment, a value of between twenty to thirty pixels is used.

Figure 5A:
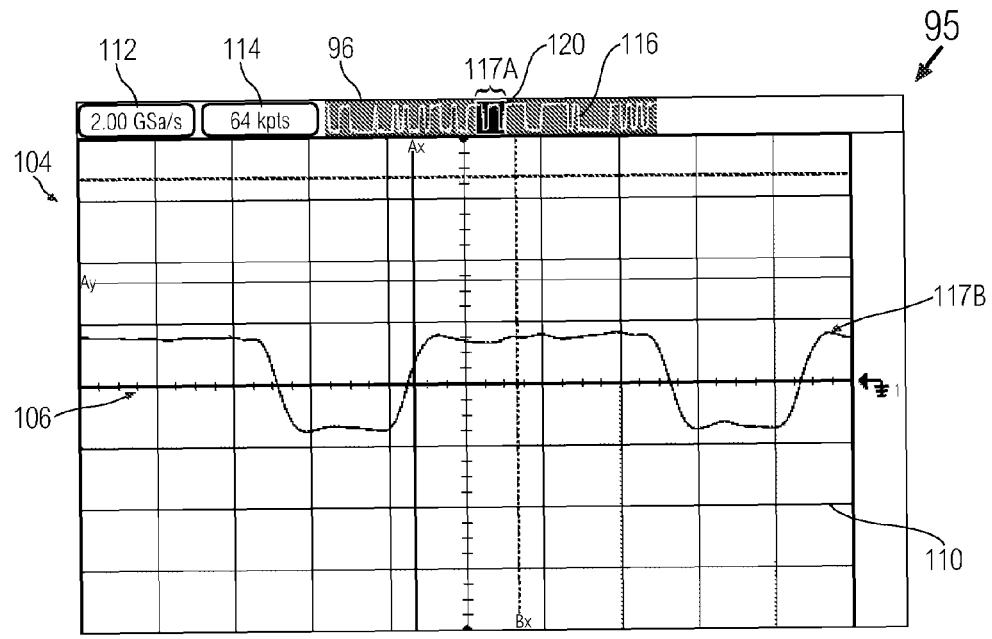
FIG. 5A is an illustration of a display screen showing a memory bar and a main waveform display presenting waveform according to one display mode of the method in FIG. 4.

If it is determined in this decision step 100 that the available pixel width is five pixels or more, the sequence 90 proceeds to a DISPLAY WAVEFORM USING AN ANALOG DISPLAY MODE step 102, wherein the processor 22 renders the entire trace in the waveform RAM 62 according to an analog display mode to generate a pixel image 104 as shown in FIG. 5A. The rendered pixel image 104 is stored in the RAM 24 for display on the display screen 95. The rendered pixel image 104 includes the memory bar 96 and a second display portion in the form of a main waveform display 106. The main waveform display 106 is displayed over a substantial portion of the display screen 95. One, or in other cases more waveforms, and other display elements are presented over a graticule 110 on the main waveform display 106. The memory bar 96 is located above the main waveform display 106. To the left of the memory bar 96, above the top left hand periphery of the main waveform display 106 are a number of information display windows 112, 114. One display window 112 shows the sampling rate for obtaining the trace in the waveform RAM 62. Another display window 114 shows the number of samples stored in the waveform RAM 62. In the illustrative example shown in FIG. 5A, a single trace 116 of 64K samples is displayed in the memory bar 96 and a portion 117A thereof is in turn displayed as a magnified trace portion 117B in the main waveform display 106. The trace 116 may, for example, be a channel 1 waveform that is captured or acquired and stored in the waveform RAM 62. In this embodiment, the size of the memory bar 96 is smaller than the size of the main waveform display 106, such as less than 10% of the size of the main display waveform 106. However, it is possible that the size of the memory bar 96 is equal to or greater than the size of the main display waveform 106. According to this embodiment, the memory bar 96 is used solely for navigational purposes.

The trace in the waveform RAM 62 is rendered for display in the memory bar 96 according to an analog display mode that is known to those skilled in the art wherein runts, rise time and other similar signal characteristics can be displayed. Although only one channel is shown in FIG. 5A, all available active channels may be rendered in the memory bar 96. Each channel may be rendered in a different color to distinguish it from the other channels for easier viewing. The memory bar 96 includes a first selection window 120 for selecting a portion of the trace 116 in the waveform RAM 62 for magnified display in the main waveform display 106. The background of the first selection window 120 is darker than the background of the other portion of the memory bar 96 so that the first selection window 120 is conspicuous. The operator may move or resize the first selection window 120 using the GUI and the pointing device 30 to select any portion 117A of the trace 116 for displaying in an enlarged scale in the main waveform display 106. To navigate the trace 116 in the memory bar 96, the operator may click on the first selection window 120 and drag it left or right to select a different portion 117A of the trace 116. In this manner, the operator can move the first selection window 120 to any portion 117A of the trace 116 that is of interest to see its details in the main waveform display 106. The operator may also point to and drag the edges of the first selection window 120 to resize the first selection window 120 so as to be able to select more or less of the trace 116 for display in the main waveform display 106. In other words, the first selection window 120 is resizable to provide the operator with zoom in or zoom out ability.

Alternatively, to navigate the trace using the first selection window 120, a selection window toolbar (not shown) may be included in the GUI to provide information pertaining to the horizontal scale and offset of the first selection window 120. The selection window toolbar includes a horizontal scale control for controlling the horizontal scale or size of the first selection window 120, and a horizontal offset control for controlling the horizontal offset or position of the first selection window 120 in the memory bar 96. An associated horizontal scale display window presents the current horizontal scale of the selection window 120 to the operator. Likewise, an associated horizontal offset display window presents the current horizontal offset of the selection window to the operator. With the entire trace displayed in the memory bar 96 according to the analog display mode, the operator is better able to navigate to a portion 117A of the waveform or trace 116 that is of interest.

If it is determined in the AVAILABLE PIXEL WIDTH≥5? decision step 100 that the available pixel width is less than five pixels, the sequence 90 proceeds to an AVAILABLE PIXEL WIDTH≥1? decision step 124, wherein the processor 22 determines if the available pixel width for displaying the narrowest pulse is greater than or equal to one pixel. Again, although one pixel is used in this embodiment, it should be recognized that a different number of pixels, such as two or more pixels may also be used. It should however be noted that the number of pixels used in this decision step 124 should be lower than the number of pixels used in the AVAILABLE PIXEL WIDTH>=5? decision step 100. If it is determined in this decision step 104 that the available pixel width is one pixel or more, the sequence 90 proceeds to a DISPLAY WAVEFORM USING DIGITAL DISPLAY MODE step 128, wherein the processor 22 renders the entire trace in the waveform memory according to a digital display mode. The rendered data is stored in the RAM 24 for display on the display screen 95.

Figure 5B:
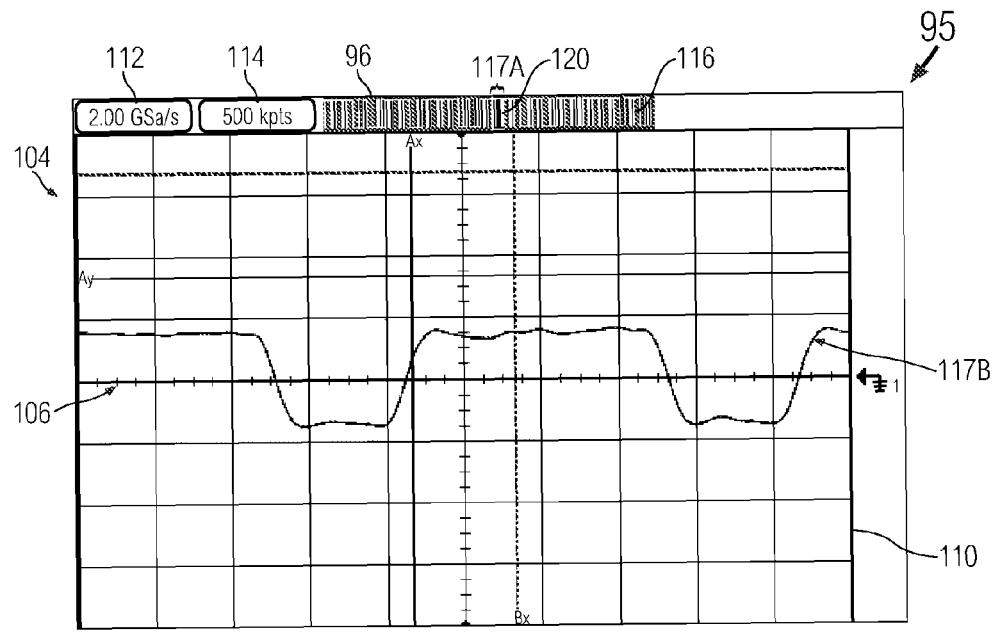
FIG. 5B is a further illustration of the display screen showing the memory bar and the main waveform display in FIG. 5A presenting waveform according to another display mode of the method in FIG. 4.

In the digital display mode, the rendered pixel image 104 for display on the display screen 95 includes the memory bar 96 and the main waveform display 106 as shown in FIG. 5B. The trace 116 is, however, rendered in the memory bar 96 according to a digital display mode instead of the analog display mode described above. This digital display mode is also known to those skilled in the art. In this digital display mode, pulses are rendered as logic highs and lows with pixel widths ranging from one to four pixels depending on the depth of the trace. That is, a minimum pixel width for rendering a pulse is one pixel. In the trace 116, which has now reached 500K samples, a pulse is determined by using a threshold specified by the operator. Whenever a signal portion exceeds the threshold and thereafter falls below that threshold, that signal portion above the threshold is considered a pulse. The method of pulse identification in a digital display mode is also well defined in the oscilloscope literature which those skilled in the art are familiar with. The same magnified trace portion 117B in FIG. 5A remains unchanged and is displayed in the main waveform display 106 as shown in FIG. 5B when the processor 22 switches from displaying the trace 116 using the analog display mode to displaying the trace 116 using the digital display mode. The displayed size of the first selection window 120 is, however, correspondingly reduced.

Even though useful information related to the trace of an electrical signal, such as analog anomalies like runts, slow rise times, etc. can no longer be displayed when the trace 116 is displayed in the digital display mode, displaying only the digital values for the entire trace 116 is, nevertheless, still useful for navigational purposes. This is evident in logic analyzers where only digital values are displayed. Also, the displayed trace shown is what the operator is accustomed to seeing in integrated circuit data books.

If it is determined in the AVAILABLE PIXEL WIDTH≥1? decision step 124 that the available pixel width is less than one pixel, which is likely the case when the trace grows deeper, the entire trace can no longer be meaningfully displayed in the memory bar 96 even when displayed using the digital display mode. When this happens, the processor 22 displays a trace portion 150B of the trace 116 instead such that that trace portion 150B is displayed meaningfully. In order to do that, the sequence 90 proceeds to a DISPLAY TRACE PORTION USING A TWO-LEVEL MODE step 130, wherein the processor 22 renders a trace portion 150B of the trace 116 in the RAM 24 such that the narrowest pulse in the trace 116 can be displayed in at least a digital display mode wherein the narrowest pulse is represented by a single pixel. In other embodiments, the processor 22 renders the trace portion 150B such that the narrowest pulse in the trace is displayed with a larger number of pixels in the digital display mode or in the analog display mode. The pixel width for displaying the narrowest pulse will determine the size of the trace portion 150B that can be displayed in the memory bar 96. The trace portion 150B that is selected for display in the memory bar may be centered on the narrowest pulse in the trace 116. Alternatively, the portion 150B may be a center portion of the entire trace 116 or a latest captured portion.

In this DISPLAY TRACE PORTION USING A TWO-LEVEL MODE step 130, the processor 22 also displays a further trace portion 152A of the trace portion 150B in the main waveform display 106. The size of this trace portion 152A is selected such that the narrowest pulse in the trace portion 150B is displayable in the main waveform display 106 at a pixel width of at least five pixels. The main waveform display 106 thus provides a magnified view of an operator-selected portion 152A or region of the trace portion 150B. In the DISPLAY TRACE PORTION USING A TWO-LEVEL MODE step 130, the entire trace 116 in the waveform RAM 62 is no longer displayed in the memory bar 96 but only the trace portion 150A thereof. However, the displayed trace portion 150B of the entire trace 116 nevertheless shows not only the trace portion 152A that is displayed in the main waveform display 106 but also portions of the trace 116 neighboring that trace portion 152A. In other words, even though the operator is no longer able to view the entire trace 116 in the memory bar 96, the operator is still able to view trace portions adjacent the trace portion 152A. This manner of displaying waveform might give the operator a clearer understanding of what is happening in the trace portion 152A that is displayed as the magnified trace portion 152B in the main waveform display 106.

Figure 5C:
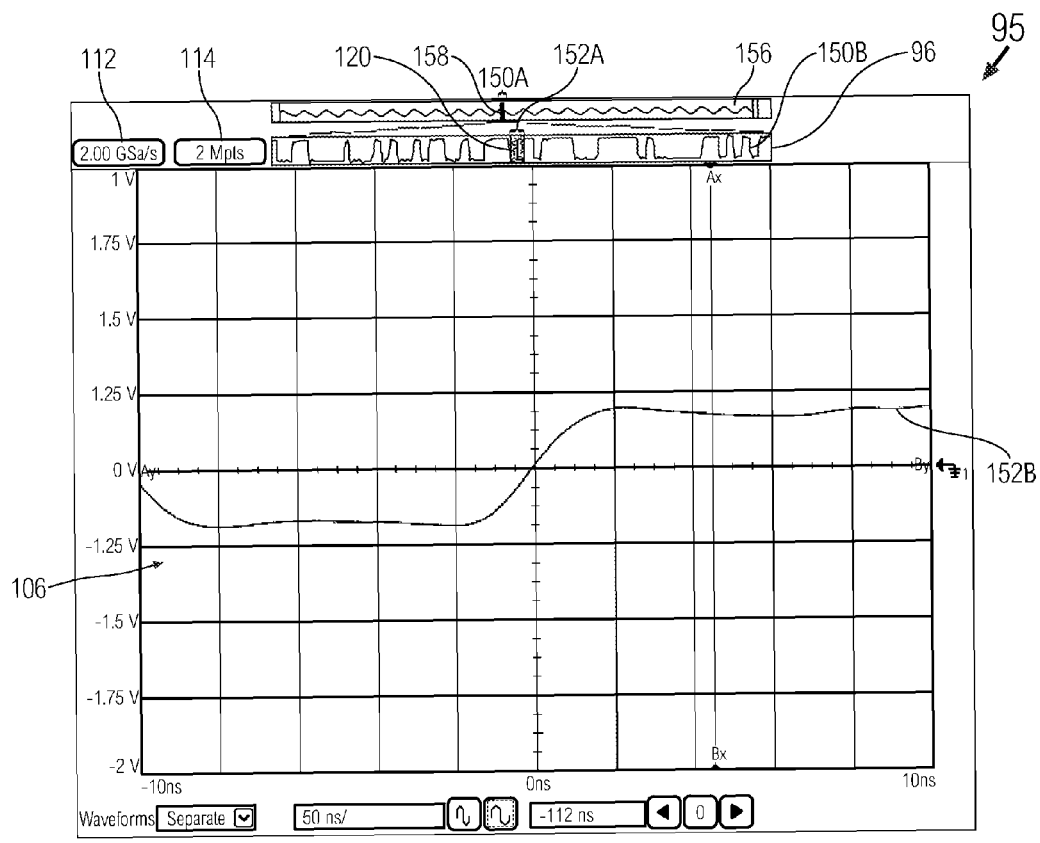
FIG. 5C is yet a further illustration of the display screen showing a trace portion location display, the memory bar and the main waveform display in FIG. 5A presenting waveform according to a further display mode of the method in FIG. 4.

The sequence 90 next proceeds to a DISPLAY TRACE PORTION LOCATION step 132, wherein the processor 22 renders, in a third display portion, a trace portion location display 154 that shows the location of the trace portion 150B within the entire trace 116 that is displayed in the memory bar 96. This trace portion location display 154 may include a bar 156 that represents the depth of the entire trace 116 stored in the waveform RAM 62 and a second selection window 158 with a width that corresponds to the portion 150B of entire trace 116 that is displayed in the memory bar 96. The width of the second selection window 158 can be narrowed to view a smaller portion of the entire trace 116 in the memory bar 96 in more detail. Again, this second selection window 158 may be manipulated in the same manner as the first selection window 120 as described above. When the trace 116 is very deep, such as 2 M samples deep, the width of the second selection window 158 may be reduced to appear as a short vertical line as shown in FIG. 5C.

The trace portion location display 154 may be rendered in a portion of the display screen 95 that is not previously by the memory bar 96 and the main waveform display 106. In such a case, there is no change in the size of the memory bar 96 or the main waveform display 106. Alternatively, the size of either one or both of the memory bar 96 and the main waveform display 106 may be reduced to accommodate this trace portion location display 154. In such a case, since this display option reduces the size of one or both of the memory bar 96 and the main waveform display 106, this display option may thus not be desirable all the time. Consequently, the operator may turn this display option on or off via the GUI or the keyboard 28. When this display option is off, the trace portion location display 154 will not be displayed.

Figure 1:
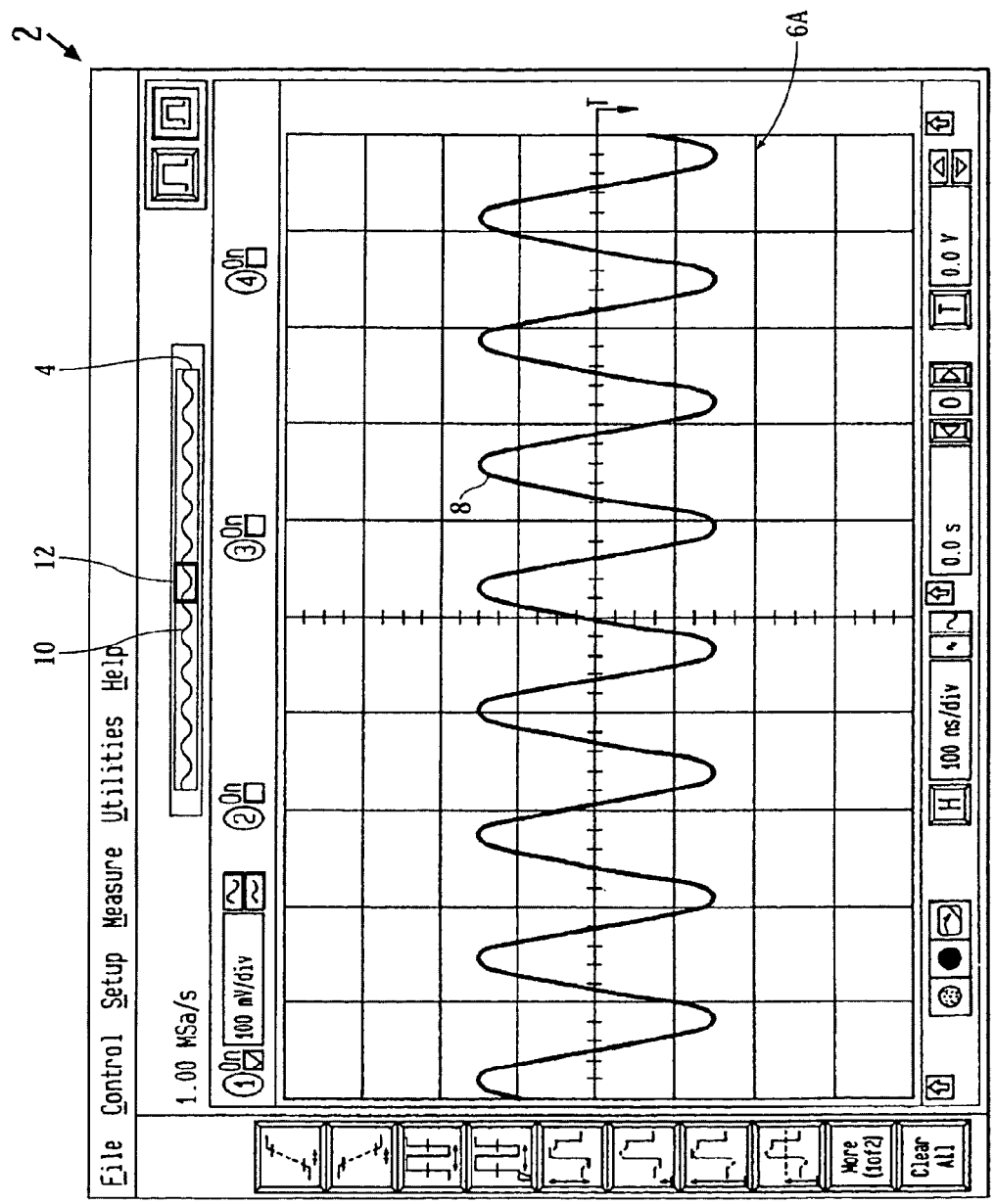
FIG. 1 is an illustration of a prior art graphical user interface display screen showing a main waveform display encompassing a significant portion of the display screen.
Figure 2:
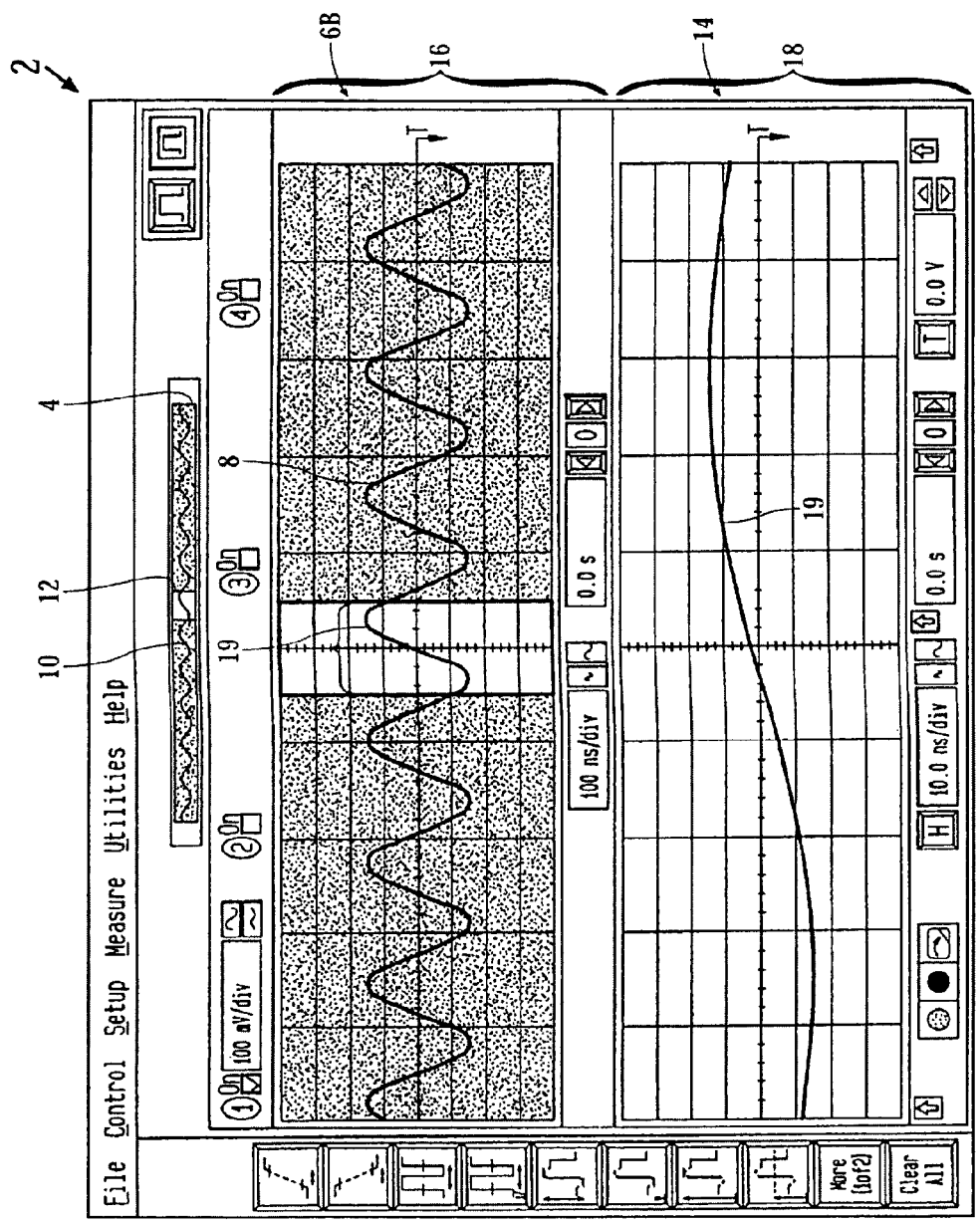
FIG. 2 is an illustration of the display screen in FIG. 1 showing a main waveform display that is reduced in size and a magnified waveform display simultaneously displayed on the display screen.

If rendering the memory bar 96 as described above adversely affects the update rate of the DSO 20, the memory bar 96 can be rendered like as the prior art memory bar 4 in FIG. 2, i.e. without rendering the actual trace in the memory bar 96. Alternatively, if the memory bar 96 is to be rendered to show the actual trace, a separate low priority thread can be used to implement such a task so that the performance of the DSO 20 during signal acquisition is not adversely impacted. Implementing the task in such a manner may however mean that the entire trace may not be visible in the memory bar 96 immediately after signal acquisition but will appear only after some time lapse.

Although the present invention is described as implemented in the above described embodiment, it is not to be construed to be limited as such. For example, the trace for display in the memory bar 96 need not be the entire trace in the waveform RAM 62 as described above but only a selected portion thereof. As another example, the first display portion need not be a memory bar 96 that occupies only a small portion of a display screen 95 as described above but the first display portion may be a display portion of any size, including one that occupies the entire display screen. For such an embodiment, the display screen may be switched between displaying this entire trace and displaying a selected portion thereof.

As a further example, each selection window may also be defined by an extent (scale) and a position (offset) for each of the two axes of the selection window instead of for only the horizontal axis as described above.

What is claimed is:

1. A method comprising:
   determining the narrowest pulse in a waveform for display;
   determining an available pixel width for displaying the narrowest pulse in a first display portion of a display when the entire waveform is to be displayed in the first display portion, wherein a pixel width comprises a number of pixels and the first display portion comprises at least a portion of the display; and
   displaying one of the entire waveform and a portion thereof in the first display portion depending on the available pixel width.

2. The method according to claim 1, wherein displaying one of the entire waveform and a portion thereof in the first display portion depending on the available pixel width comprises:
   displaying the entire waveform in the first display portion when the available pixel width is one of greater than and equal to a first pixel width; and
   displaying a portion of the waveform in the first display portion when the available pixel width is smaller than the first pixel width.

3. The method according to claim 2, wherein displaying the entire waveform in the first display portion when the available pixel width is one of greater than and equal to a first pixel width comprises:
   displaying the entire waveform in the first display portion in an analog display mode when the available pixel width is one of greater than and equal to a second pixel width that is greater than the first pixel width; and
   displaying the entire waveform in the first display portion in a digital display mode when the available pixel width is smaller than the second pixel width.

4. The method according to claim 3, wherein the first pixel width is one pixel and the second pixel width is five pixels.

5. The method according to claim 2, wherein displaying a portion of the waveform in the first display portion when the available pixel width is smaller than the first pixel width comprises displaying a portion of the waveform in the first display portion such that the narrowest pulse is displayable in at least the first pixel width.

6. The method according to claim 2, further comprising displaying in a second display portion an operator-selectable portion of the waveform displayed in the first display portion.

7. The method according to claim 6, further comprising displaying in a third display portion a location of the waveform portion displayed in the first display portion within the entire waveform for display.

8. The method according to claim 7, further comprising reducing a size of at least one of the first display portion and the second display portion to accommodate at least part of the third display portion.

9. The method according to claim 6, wherein the first display portion has a size that is less than 10% of a size of the second display portion.

10. The method according to claim 1, wherein the first display portion comprises a display portion solely for navigational purposes.

11. The method according to claim 1, wherein the waveform for display comprises one of a part of and an entire waveform stored in a memory.

12. A non-transitory computer readable medium that stores a program executable by a computing device, tangibly embodying a program of instructions, executable by the computing device to perform a waveform display method, the method comprising:
   determining the narrowest pulse in a waveform for display;

determining an available pixel width for displaying the narrowest pulse in a first display portion of a display when the entire waveform is to be displayed in the first display portion, wherein a pixel width comprises a number of pixels and the first display portion comprises at least a portion of the display; and displaying one of the entire waveform and a portion thereof in the first display portion depending on the available pixel width.

13. A signal measurement system comprising:
a signal acquisition subsystem for capturing a waveform and storing data associated with the captured waveform in a memory;
a display;
means for determining the narrowest pulse in the waveform stored in the memory;
means for determining an available pixel width for displaying the narrowest pulse in a first display portion of the display when the entire waveform is to be displayed in the first display portion, wherein a pixel width comprises a number of pixels and the first display portion comprises at least a portion of the display; and
means for displaying one of the entire waveform and a portion thereof in the first display portion depending on the available pixel width.

14. The signal measurement system according to claim 13, wherein the means for displaying one of the entire waveform and a portion thereof in the first display portion depending on the available pixel width comprises:
means for displaying the entire waveform in the first display portion when the available pixel width is one of greater than and equal to a first pixel width; and
means for displaying a portion of the waveform in the first display portion when the available pixel width is smaller than the first pixel width.

15. The signal measurement system according to claim 14, wherein the means for displaying the entire waveform in the first display portion when the available pixel width is one of greater than and equal to a first pixel width comprises:
means for displaying the entire waveform in the first display portion in an analog display mode when the available pixel width is one of greater than and equal to a second pixel width that is greater than the first pixel width; and
means for displaying the entire waveform in the first display portion in a digital display mode when the available pixel width is smaller than the second pixel width.

16. The signal measurement system according to claim 15, wherein the first pixel width is one pixel and the second pixel width is five pixels.

17. The signal measurement system according to claim 14, wherein the means for displaying a portion of the waveform in the first display portion the available pixel width is smaller than the first pixel width comprises means for displaying a portion of the waveform in the first display portion such that the narrowest pulse is displayable in at least the first pixel width.

18. The signal measurement system according to claim 14, further comprising means for displaying in a second display portion an operator-selectable portion of the waveform displayed in the first display portion.

19. The signal measurement system according to claim 18, further comprising means for displaying in a third display portion a location of the waveform portion displayed in the first display portion within the entire waveform for display.

20. The signal measurement system according to claim 19, further comprising means for reducing a size of at least one of the first display portion and the second display portion to accommodate at least part of the third display portion.

* * * * *